US010746792B1

(12) United States Patent
Diamant et al.

(10) Patent No.: US 10,746,792 B1
(45) Date of Patent: Aug. 18, 2020

(54) DEBUG MECHANISMS FOR A PROCESSOR CIRCUIT

(71) Applicant: Amazon Technologies, Inc., Seattle, WA (US)

(72) Inventors: Ron Diamant, Albany, CA (US); Gil Stoler, Nofit (IL); Nafea Bshara, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/206,761

(22) Filed: Nov. 30, 2018

(51) Int. Cl.
*G01R 31/28* (2006.01)
*G01R 31/317* (2006.01)
*G06N 20/00* (2019.01)

(52) U.S. Cl.
CPC . *G01R 31/31705* (2013.01); *G01R 31/31727* (2013.01); *G06N 20/00* (2019.01)

(58) Field of Classification Search
None
See application file for complete search history.

(56) References Cited

U.S. PATENT DOCUMENTS

| | | | | |
|---|---|---|---|---|
| 6,304,125 B1* | 10/2001 | Sutherland | ......... | H03K 5/15013 327/141 |
| 2002/0138801 A1* | 9/2002 | Wang | ............... | G01R 31/31704 714/729 |
| 2004/0168134 A1* | 8/2004 | Prasad | ...................... | G06F 1/04 716/129 |
| 2010/0321042 A1* | 12/2010 | Agarwal | ................ | G01R 31/27 324/681 |
| 2014/0204645 A1* | 7/2014 | Ohmaru | ......... | G01R 31/318597 365/72 |
| 2015/0276874 A1* | 10/2015 | Morton | .............. | G01R 31/3177 714/727 |
| 2016/0105174 A1* | 4/2016 | Uesugi | ................ | H01L 27/1225 326/102 |

* cited by examiner

*Primary Examiner* — Mujtaba M Chaudry
(74) *Attorney, Agent, or Firm* — Kilpatrick Townsend & Stockton LLP

(57) ABSTRACT

An error-handling processing circuit and system are provided. The system can receive an error signal, such as an interrupt, and decouple (e.g., by a gate signal) a functional clock from a processing block, in some instances effectively halting the processing block's operation. This can prevent a cascade of interdependent errors, thereby avoiding producing redundant or confusing error information. The system can include the processing block, a debug clock not coupled to the processing block, and a data block (e.g., a register file) coupled to the debug clock and to an external input/output interface. The data block can be configured to continue receiving a clock signal via a multiplexer from the debug clock without disruption after the functional clock is decoupled, enabling the data block to remain operational for debugging.

20 Claims, 10 Drawing Sheets

DEBUG MECHANISMS FOR A PROCESSOR CIRCUIT

BACKGROUND

In debugging a hardware failure, a particularly difficult challenge is determining the root-cause of failure. This challenge may be complicated by a number of factors. For example, typically a hardware system can only be tested for a limited number of error cases. As a result, upon occurrence of an error, the behavior of the system can become unpredictable, and can produce a cascade of interdependent error indications. Such a cascade can contain redundant or misleading error information, potentially confusing even an experienced engineer. In a typical example, an error register might report five or ten interrupts in parallel, all of which might owe to a singular failure event, such as a bit flip.

BRIEF DESCRIPTION OF THE DRAWINGS

Various embodiments in accordance with the present disclosure will be described with reference to the drawings, in which.

DETAILED DESCRIPTION

Figure 1:
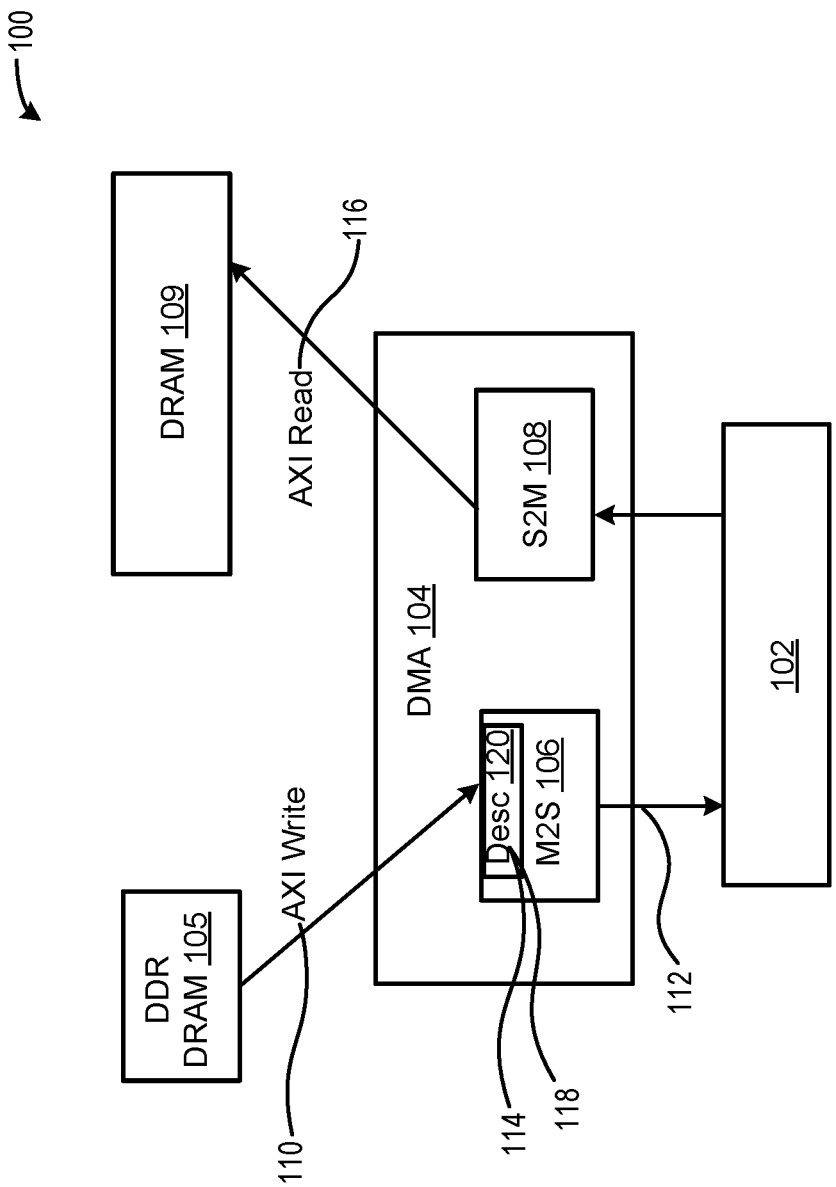
FIG. 1 illustrates an example block diagram of a hardware circuit, which includes a processing block.

Contemporary processors and computing engines are highly complex. In order to address difficult and computationally-intensive challenges such as machine learning (ML), image processing, neural networks, and graph traversal, contemporary systems may contain a plurality of processing elements, including computing cores, specialized processors, and accelerator components. An integrated circuit can contain a computation engine or acceleration engine, such as an ML processor. Such a specialized acceleration engine can be considerably more efficient than a general-purpose central processing unit (CPU), yet may face a tradeoff between efficiency and flexibility. In addition to diversifying and complicating the architecture of the integrated circuit, the presence of such additional components may pose interrelated hardware and software challenges such as parallel scaling efficiency, thermal budget, interconnect, communication, latency, and concurrency.

Such complexity can make hardware errors more likely, while also making them more difficult to resolve. The quantity, complexity, and diversity of processing elements can increase the likelihood of interaction conflicts, soft errors, or hardware failures. In addition, complex computing systems can be challenging for an engineer to debug upon failure.

In debugging a hardware failure, a particularly difficult challenge is determining the root-cause of failure. This challenge may be complicated by several factors. For example, typically a hardware system can only be tested for a limited number of error cases. As a result, upon occurrence of an error, the behavior of the system can become unpredictable, and can produce a cascade of interdependent error indications. Such a cascade can contain redundant or misleading error information, potentially confusing even an experienced engineer. In a typical example, an error register might report five or ten interrupts in parallel, all of which might owe to a singular failure event, such as a Static Random Access Memory (SRAM) soft error or bit flip.

When an error occurs, typically many others will follow. Furthermore, an interrupt may be received too late to correct an error, as the error may already have progressed to a failure point. For example, an uncorrectable error condition can generate an interrupt, but the interrupt is generally handled or identified by a user too late, after the hardware has already failed. In the meantime, a cascade of additional errors can occur, obscuring the original one.

In a typical example, when reading from memory, a system may encounter an uncorrectable error, such as a flipped bit, in the memory. This memory error may be detected and recorded in an error register, and may generate an interrupt. Nevertheless, before the interrupt can be handled, the corrupted data may still be read into a state machine, which will continue to carry out its stages based on the data. Specifically, the system may parse the corrupted data and perform a computation, which can produce additional errors as a result of the data being corrupt. Eventually, this cascade of errors can cause the hardware to fail. Accordingly, by the time a user becomes aware of the error and is able to inspect the state of the hardware, additional errors (e.g., three to five errors) may already have been asserted, and may generate additional catastrophic interrupts. As a result, it can be difficult for the user to determine which catastrophic error is the root cause, and which errors are secondary.

Debug mechanisms, system, and methods for an integrated circuit are provided herein. The disclosed system can detect a condition such as an error signal or an interrupt, and disable (e.g., by a gate signal or decoupling) a functional clock, in certain instances effectively halting a processing block's operation. This can prevent a cascade of interdependent errors, thereby avoiding producing redundant or confusing error information. The system can include a processing block, a debug clock not coupled to the processing block, and a data block (e.g., a register file) coupled to the debug clock and to an external input/output interface. The data block can be configured to continue receiving a clock signal via a multiplexer from the debug clock without disruption after the functional clock is decoupled, enabling the data block to remain operational for input and output during debugging.

In the description herein, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates an example block diagram of a hardware circuit 100, which includes a processing block 102. Under certain conditions, the operation of this hardware circuit 100 may result in a cascade of errors. Such a cascade of errors can be challenging for an engineer to debug, since it is difficult to root out the error that resulted in the cascade of errors. For example, an error register that has different fields to indicate errors of different types may be updated to indicate that that multiple errors were received without any indication of the order in which the errors were generated. Furthermore, in some instances, some errors may squash (or overwrite) other errors when multiple errors of the same type cascade. In such scenarios, debugging and root causing the issue may be difficult for even very experienced engineers. All of the reported errors can originate from a single failure, such as a Static Random Access Memory (SRAM) soft error, as described herein, or possibly from another type of failure. In a typical example, hardware circuit 100 may be an integrated circuit containing a processor or a hardware engine, such as a hardware acceleration engine and/or an inferential machine learning (ML) engine, which may contain multiple processing elements (PEs) in parallel.

In this example, hardware circuit 100 may include direct memory access (DMA) engine 104 and a processing block 102. DMA engine 104 may further include a memory-to-stream (M2S) interface 106 and a stream-to-memory (S2M) interface 108. In certain embodiments, the processing block 102 may be an acceleration engine. In one example, DMA engine 104 can read from some memory location, such as from double data rate dynamic random access memory (DDR DRAM). DMA engine 104 can then send the read values through M2S interface 106 to processing block 102. Processing block 102 (e.g. an acceleration engine) can perform a computational operation such as encryption, a cyclic redundancy check (CRC), etc., and write the results of the operation back to DMA engine 104. DMA engine 104 then writes the result back through S2M interface 108 to a memory location, e.g., in DRAM 109.

In an example scenario depicted by FIG. 1, five errors are asserted and reported to the engineer, yet the originating timeline of these errors remains obscure: an Advanced Extensible Interface (AXI)-to-DMA read timeout 110, a DMA-to-engine timeout 112, an SRAM soft error 114, a DMA-to-AXI write timeout 116, and a DMA corrupted descriptor 118. Note that the errors are shown schematically in FIG. 1, at the point where they originate.

In this example, the cascade of errors may be interrelated. As a consequence of a bad (i.e., flipped) bit, the M2S side of hardware circuit 100 encounters a timeout, triggering the first error. Immediately thereafter, an M2S-to-engine timeout may follow as the second error. Typically, AXI-to-DMA read timeout 110 and DMA-to-engine timeout 112 may be very closely related errors, and therefore may occur together in close succession. Likewise, DMA-to-AXI write timeout 116 is somewhat related to AXI-to-DMA read timeout 110, and therefore may reasonably coincide with the other errors in this example. By contrast, SRAM soft error 114 may be an entirely unrelated error, and therefore its occurrence together with the other errors may cause confusion to an engineer during debugging.

In fact, the entire cascade of errors in this example can originate from an SRAM soft error, as follows. DMA 104 can store a DMA descriptor 120 in SRAM, which describes a transaction to be performed by DMA 104. Hardware circuit 100 can read descriptor 120 from SRAM. Due to hardware failure, or another fault such as a bit flip, SRAM generates a soft error (triggering SRAM soft error 114). In a typical example, hardware circuit 100 detects this, e.g., by receiving an interrupt, and can further alert an engineer to this error.

Shortly thereafter, DMA 104 can detect that descriptor 120 is corrupted (i.e., triggering DMA corrupted descriptor 118). DMA 104 can read descriptor 120 from memory, but because descriptor 120 is corrupted, will access an incorrect address. Accordingly, this incorrect address will time out (i.e., triggering AXI-to-DMA read timeout 110). Since DMA 104 cannot read data from memory, it cannot send the data to processing block 102 (such as an acceleration engine). Thus, AXI-to-DMA read timeout 110 immediately causes DMA-to-engine timeout 112. As a result, processing block 102 may become trapped in an intermediate state, and fail to write data out. This can cause a timeout on write (i.e., triggering DMA-to-AXI write timeout 116).

Eventually, hardware circuit 100 may fail, and an engineer attempts to debug the problem based on error information reported by the circuit. While the cascade of errors described in this example is interdependent, most of the errors are unrelated to the original SRAM soft error 114. As a result, the cascade of error notifications serves to obscure the starting point of the failure. In order to debug the problem successfully, it would be beneficial for an engineer to receive only relevant error information, and to be able to interact with the state of hardware circuit 100, such as data in a register file, after the failure. At least some embodiments of the disclosed error-handling integrated circuit and methods provide such advantages. In particular, at least some embodiments of the disclosed circuit, system, and methods can rapidly disable an integrated circuit's functional clock after a failure, and/or can continue to activate the circuit's data block via a separate debug clock to retrieve the state of the hardware circuit 100, as described herein.

Figure 2:
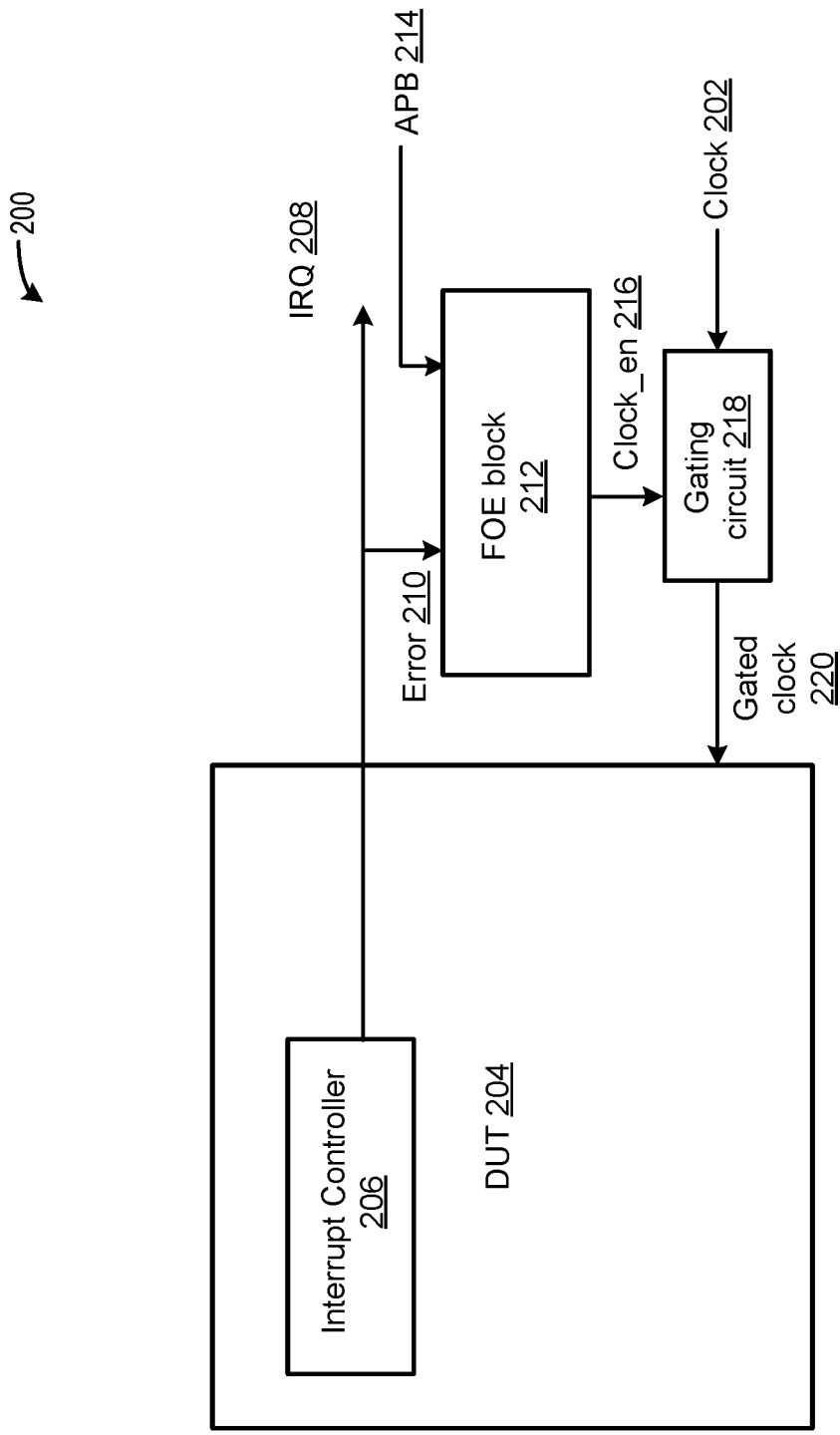
FIG. 2 is a circuit diagram illustrating an example integrated circuit with debug mechanisms that allow disabling of a functional clock based on certain conditions, according to certain aspects of the disclosure.

FIG. 2 is a circuit diagram illustrating an example integrated circuit 200 with debug mechanisms that allow disabling of the functional clock 202 based on certain conditions, according to certain aspects of the disclosure. In this example, a cascade of errors such as in the example of FIG. 1 is unlikely to occur. In particular, functional clock 202 is blocked or disabled (e.g., by a gate signal or by decoupling) very promptly in response to a specific condition, such as receipt of an initial error notification, thereby halting operation of integrated circuit 200 with debug mechanisms before the cascade ensues.

In various embodiments, device under test (DUT) 204 includes a processing circuit configured to execute operations, such as computations and/or instructions, an acceleration engine, and/or an inferential machine learning (ML)

engine, as in the examples of FIGS. 6A and 6B described below. Integrated circuit 200 and/or DUT 204 can include further acceleration engines, integrated circuit blocks, or any other processing circuit, and are not limited by the present disclosure. DUT 204 can also include interrupt controller 206, which can send an interrupt request (IRQ) signal 208 to be detected by a condition response circuit.

Likewise, an error signal 210 or IRQ signal can also be received by freeze-on-error (FOE) block 212 (also referred to as a condition-response circuit), which can, in response, implement the blocking of functional clock 202 and/or the processing circuit or acceleration engine, according to various embodiments. In particular, FOE block 212 can also communicate with Advanced Peripheral Bus (APB) 214, and can send instruction/signal 216 to gating circuit 218, such as instructions to enable or disable functional clock 202. In an embodiment, DUT 204 uses functional clock 202 to execute its operations. However, DUT 204 can receive gated clock signal 220 from functional clock 202 via gating circuit 218. In an embodiment, an interrupt controller may also receive a clock signal (or gated clock signal) from functional clock 202.

Accordingly, when FOE block 212 determines that a condition has been satisfied (e.g., by receiving error signal 210), FOE block 212 can transmit instructions 216 to gating circuit 218 to disable functional clock 202. In some embodiments, FOE block 212 implements a mask value using a register, allowing the user to configure the error types or other conditions that cause the functional clock to freeze. Gating circuit 218 can then use a gate signal to gate functional clock 202, thereby blocking the functional clock signal from reaching DUT 204, and effectively disabling DUT 204 from executing operations. As a result, integrated circuit 200 can terminate operations of DUT 204 rapidly after the occurrence of a failure or error, e.g. within ten functional clock cycles, or within another number of functional clock cycles. In an embodiment, such rapid termination of operations can prevent a cascade of errors, such as that in the example of FIG. 1.

In an embodiment, integrated circuit 200 can avoid a race condition that potentially affects systems sending a shutdown signal across multiple hardware blocks. Such a signal could take time to propagate to different components of the hardware block, possibly allowing execution or partial execution of another operation during the lag. In particular, in an integrated circuit including a processing engine such as a hardware accelerator, the engine could include multiple (for example, 10 to 15) state machines in parallel. Blocking all of the state machines in a synchronized manner would be difficult because of the propagation time delay. Moreover, propagating a shutdown signal across multiple hardware blocks may be prone to human error, as it relies on an engineer designing the system to predict the locations to which the signal must be propagated.

By contrast, integrated circuit 200 with debug mechanisms can shut down the clock completely to the entire hardware block immediately upon receiving an error signal. In a typical example, a clock signal transmits from a centralized location to all accelerators, and is necessary for the accelerators to continue processing. Accordingly, in some embodiments, blocking a clock may be a more reliable and expeditious way to terminate processing than attempting to stop all the state machines. In some embodiments, the disclosed system may use other methods to terminate processing, and is not limited by the present disclosure.

In the example of FIG. 2, prevention of a cascade of errors can help ensure that the error information received by an engineer is more relevant to the actual, original hardware failure. However, in debugging such a failure, it may be helpful for the engineer to be able to access data, including volatile data, in integrated circuit 200, such as in a register file. In an embodiment, the disclosed error handling processor circuit can include a debug clock (as shown in FIG. 3) that enables the circuit's data block to continue to operate, and be probed by an engineer, even when the processing circuit is disabled or suspended.

Thus, in an embodiment, the disclosed system can combine functional clock disabling on error with a low-clock-frequency debug clock, in order to provide improved modalities to debug a failed hardware circuit. In particular, the disclosed system and methods can provide improvements over conventional systems that require an engineer to access the circuit and to connect a testing device, such as JTAG, to a failed hardware card in order to extract all register content from the hardware. By contrast, the disclosed system and methods allow a user to write a register causing the system to shift to debug mode, e.g., by writing to a specific API that maps to a register into the hardware engine, switching from the functional clock to the debug clock. This shift to debug mode can be accomplished, e.g., by use of a selector input signal to a multiplexer selecting the debug clock instead of the functional clock. The user can implement such a shift from an x86 server, without the need for physical access to the hardware circuit. In an embodiment, the user may moreover read and write all addresses in the chip, and access all data via memory maps. Accordingly, an engineer can remotely access all the data needed in order to debug a failure by reading data that may have caused an error, as well as writing data to reproduce an error or test whether changes fix an error. FOE block 212 can provide further configurability by implementing a mask value to specify the conditions for blocking functional clock 202.

Figure 3:
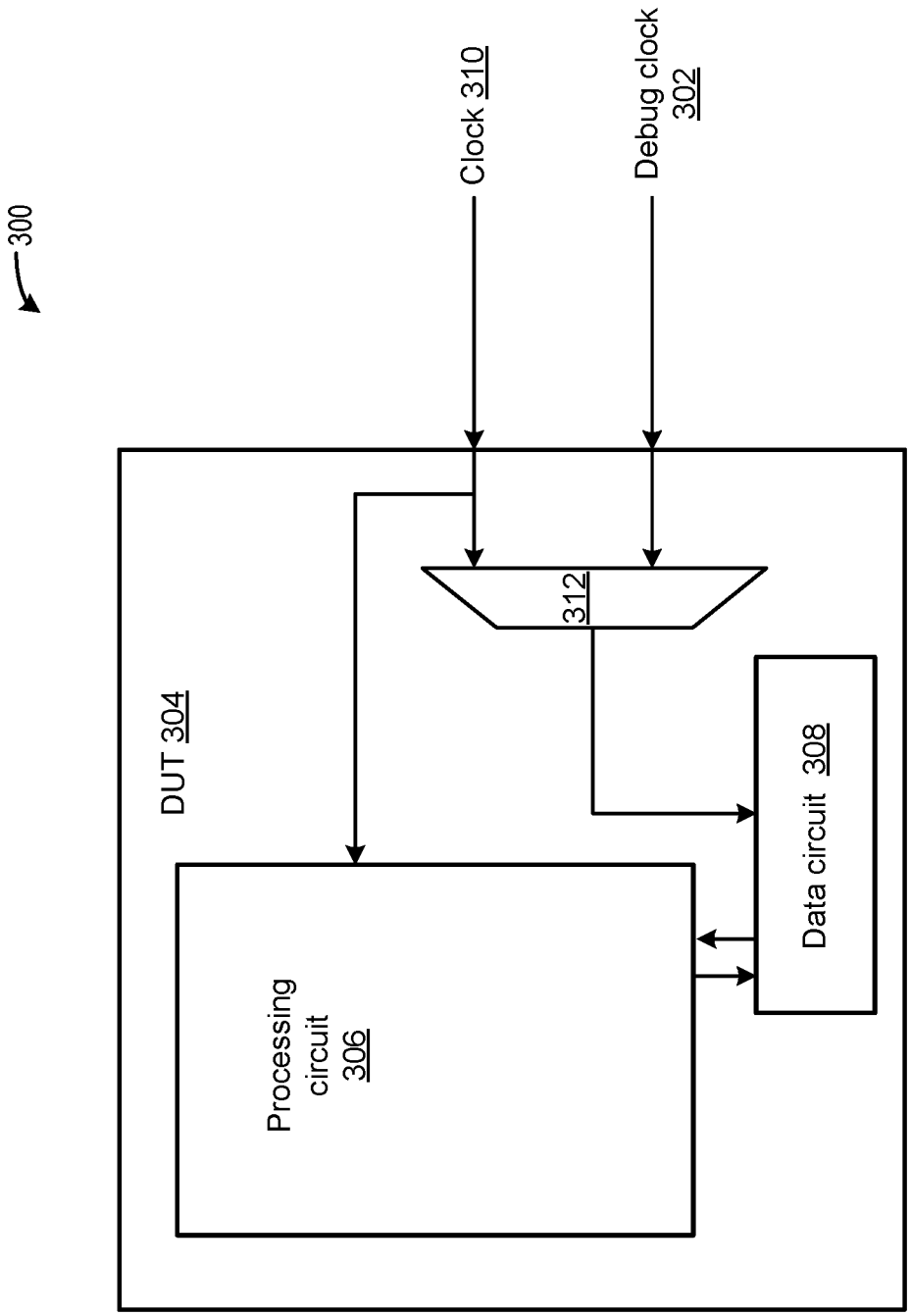
FIG. 3 is a circuit diagram illustrating an example integrated circuit with debug mechanisms including a debug clock, according to certain aspects of the disclosure.

FIG. 3 is a circuit diagram illustrating an example integrated circuit 300 with debug mechanisms, including a debug clock 302, according to certain aspects of the disclosure. In an embodiment, FIG. 3 can provide additional detail regarding DUT 204 of the example of FIG. 2, while adding structures allowing access to the circuit's data block.

In this example, integrated circuit 300 includes DUT 304, which contains processing circuit 306, such as an acceleration engine or inferential ML engine, and data circuit 308, such as a register file. Integrated circuit 300 with debug mechanisms also includes a debug clock 302 and functional clock 310.

The clock signal from functional clock 310 can be transmitted directly to processing circuit 306, enabling processing circuit 306 to perform operations such as computations, executing instructions, etc. In an embodiment, the clock signals from debug clock 302 and functional clock 310 can also be multiplexed via multiplexer 312, and the multiplexed signal can be transmitted to data circuit 308. As a result, when functional clock 310 is disabled, the clock signal from debug clock 302 can continue to be transmitted to data circuit 308 without interruption.

In an embodiment, the data circuit, e.g. registers in a register file, can remain memory mapped while receiving the debug clock signal, and can be read out, or written, in response to a user's request. Thus, the debug clock allows the user to access data, without propagating an execution pipeline. In an embodiment, all register files can switch to running via the debug clock in response to a condition, such as receiving an error signal, while all data paths and state machines will have a blocked functional clock. In an embodiment, the user can also write to the data circuit to determine whether changes to a register fix an error. Likewise, a user can write to the data circuit to reproduce a previous error, or to introduce an error purposely, for debugging or testing purposes.

In the event of a hardware failure, such as in the example of FIG. 1, the system enables a user to carry out a memory mapped read, in order to read the interrupt controller register. Thus, in the case of FIG. 1, the functional clock can be disabled very promptly after an interrupt is received (e.g., within five or ten functional clock cycles), and therefore only a few errors may be asserted. In a typical example, only the original soft error, and possibly a DMA corrupted descriptor error, are asserted. By contrast, an AXI-to-DMA read timeout will not typically be asserted, since such an error can take roughly a millisecond to be asserted. As a result, upon reading the interrupt control register, a user may see that only two bits are asserted, i.e. those for the soft error and the DMA corrupted descriptor. The user can further read static random access memory (SRAM) via the debug clock, in order to view a descriptor and determine how it became corrupted.

In various embodiments, processing circuit 306 can be disabled and/or functional clock 310 can be blocked based on various conditions, and are not limited by the present disclosure. For example, integrated circuit 300 with debug mechanisms can include a condition response circuit that can block functional clock 310 in response to a condition. In an embodiment, the condition can be defined by a user, such as an engineer. For example, the user can define an architectural condition to trigger stopping execution by processing circuit 306. Such a condition may further trigger a start to debugging, and/or to dumping data for other purposes. In another example, functional clock 306 can be blocked in response to a predefined condition, such as integrated circuit 300 receiving an error notification or interrupt request (IRQ). In an embodiment, the condition response circuit and/or integrated circuit 300 can use an enable bit, which can be set by a user, to control whether to use the debug clock in integrated circuit 300. The condition response circuit can in some instances be configured to respond to errors, and accordingly, may also be referred to as an error response circuit.

In an embodiment, the user can further control which interrupts cause the condition response circuit to disable or block the functional clock, and/or terminate processing. In particular, the user can make different decisions for different interrupt types. The IRQ output can encode the specific interrupt generated.

For example, the user can program a mask value in an FOE block, such as FOE block 212 in the example of FIG. 2, to determine which interrupts can freeze processing. In an exemplary implementation, the user stores and/or programs bits in a register in the FOE block. Accordingly, the register can perform a logical AND or NAND with the received signal (e.g., an error signal or IRQ). Depending on the mask bits set by the user, such a logical operation can produce the user's desired masking effect. Further, the FOE block may include an input register that can receive all the events and trigger the comparison.

In a further example, this provides the ability for a memory mask access to continue freezing processing indefinitely, or to stop freezing (i.e., resume processing) eventually. In various embodiments, the system can resume processing after a preset number of clock cycles, a predetermined time period, or based on some other criterion.

Figure 4:
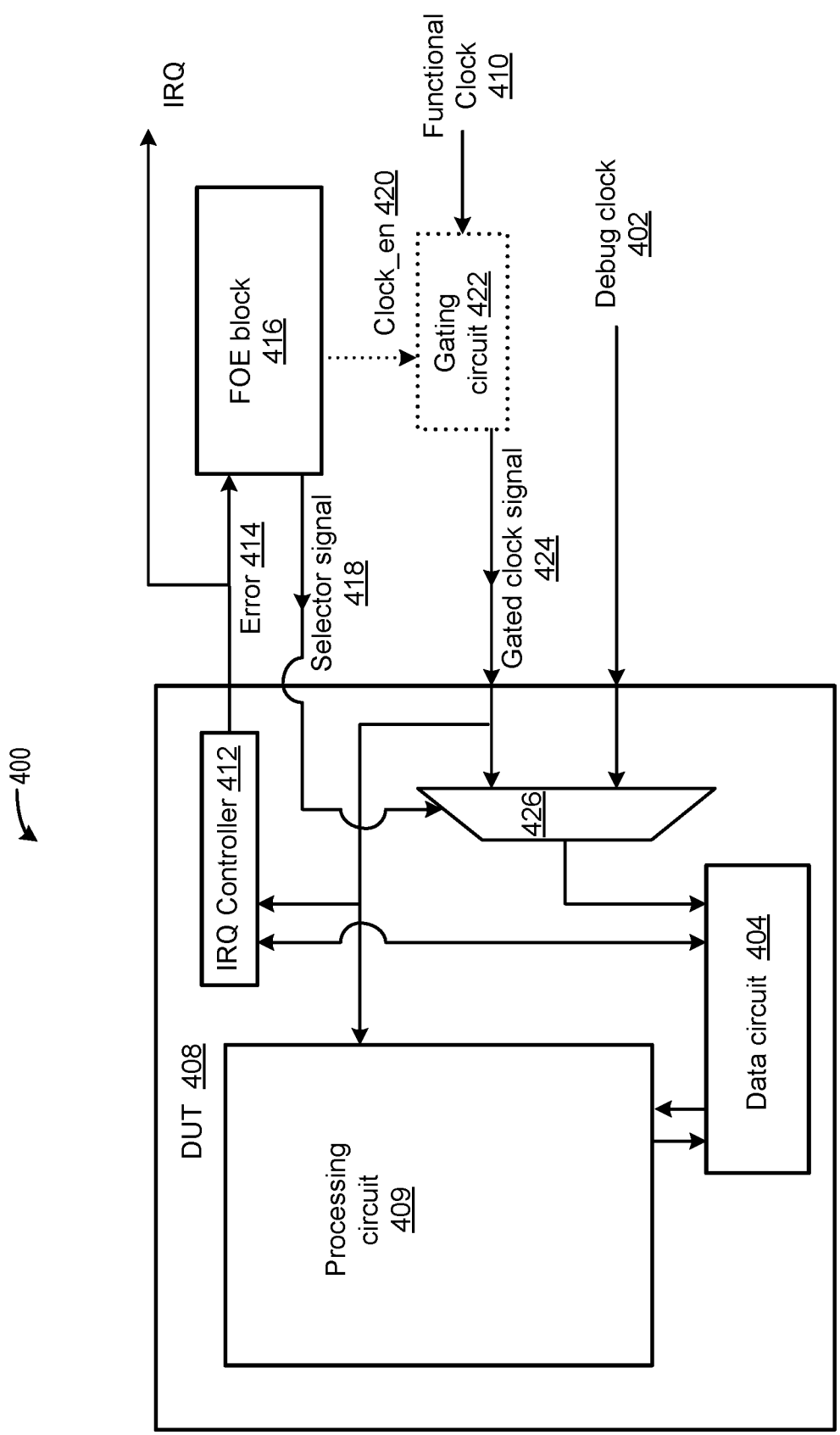
FIG. 4 is a circuit diagram illustrating an example integrated circuit with debug mechanisms including a debug clock, according to certain aspects of the disclosure.

FIG. 4 is a circuit diagram illustrating an example integrated circuit 400 with debug mechanisms, including a debug clock 402, according to certain aspects of the disclosure. As in FIG. 3, the example of FIG. 4 provides details of the DUT, and includes debug clock 402 to access data circuit 404. FIG. 4 also provides further detail on blocking functional clock 410.

Integrated circuit 400 includes DUT 408, which contains processing circuit 409 and data circuit 404, such as a register file. Integrated circuit 400 also includes debug clock 402 and functional clock 410.

In this example, IRQ controller 412 can send a signal, such as an interrupt or error signal 414, which can be detected by integrated circuit 400 and/or a condition response circuit, such as FOE block 416. Accordingly, integrated circuit 400 and/or FOE block 416 can block functional clock 410, e.g., by a gate signal, as discussed in the example of FIG. 2 above. In some embodiments, in response to a condition, such as receiving error signal 414, FOE block 416 can send selector input signal 418 to multiplexer 426, instructing multiplexer 426 to select the clock signal from debug clock 402. When the condition is not satisfied, selector input signal 418 can indicate that multiplexer 426 should select the clock signal from functional clock 410.

In some embodiments, in response to a condition such as error signal 414, FOE block 416 can send instruction/signal 420 to gating circuit 422, such as instructions to enable or disable functional clock 410. Gated clock signal 424 can then be transmitted from gating circuit 422 to multiplexer 426. Note that gating circuit 422 is optional, and does not limit the present disclosure. In particular, gating circuit 422 is optional because multiplexer 426 can deselect the signal from functional clock 410 in response to selector input signal 418 from FOE block 416. Thus, in an embodiment, the signal from functional clock 410 can be coupled directly to multiplexer 426. In this case, processing circuit 409 can be blocked by multiplexer 426, for example, in response to selector input signal 418 indicating that the signal from debug clock 402 should be selected. Other blocking mechanisms are also possible, such as a switch, and are not limited by the present disclosure.

In an embodiment, functional clock 410 can be blocked rapidly, such as within ten functional clock cycles (or another number of clock cycles) of IRQ controller 412 receiving the error signal. Because the clock signals from debug clock 402 and functional clock 410 (in an embodiment, gated clock signal 424) can be multiplexed via multiplexer 426, the clock signal from debug clock 402 can continue to be transmitted to data circuit 404 without interruption when functional clock 410 is disabled.

In particular, multiplexer 426 can select between the clock signals from debug clock 402 and functional clock 410 based on circumstances corresponding to normal operation, the occurrence of an error or other condition, or the disabling of functional clock 410. Under normal operating circumstances, multiplexer 426 may select the clock signal from functional clock 410, allowing processing circuit 409 to operate. In a typical embodiment, the triggering of the debug condition, coupled with an enable for the debug mechanism, can cause multiplexer 426 to switch to selecting the signal from debug clock 402. In another example, selector input signal 418 from FOE block 416 can instruct multiplexer 426 which signal to select. In some embodiments, the debug condition (i.e., the condition for selecting the debug clock signal) can be independent from the error response condition, that is, the system may allow a user to set masks and/or conditions for these two events independently. In another embodiment, the debug and error response conditions can be identical. In yet another example, multiplexer 426 can switch to the debug clock signal in response to the disabling of functional clock 410 and/or failing to receive a signal from functional clock 410.

In an embodiment, DUT 408 and IRQ controller 412 may receive clock signals from functional clock 410 unless functional clock 410 is blocked. In an embodiment, integrated circuit 400 further includes a read/write memory interface (not shown in FIG. 4) to the data circuit (e.g., register file). In various embodiments, such a read/write memory interface can be clocked by functional clock 410 and/or debug clock 402. In an embodiment, such an interface need not go through the hardware clock and/or hardware circuit shown in the example of FIG. 4.

FIGS. 5A-5D illustrate examples of methods for error handling in processing hardware. These methods may be implemented by the systems described above, such as for example the integrated circuits, error handling processor circuits, and/or DUTs of FIGS. 2-4.

Figure 5A:
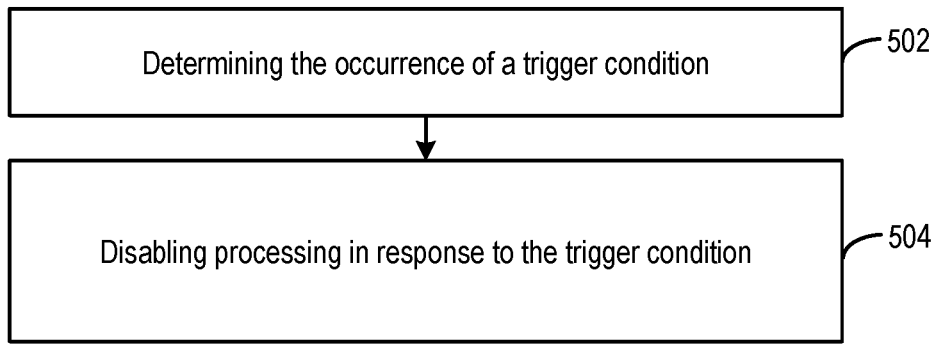
FIG. 5A includes a flowchart illustrating an example of a process for error handling in an integrated circuit, according to certain aspects of the disclosure.

FIG. 5A includes a flowchart illustrating an example of a process 500 for error handling in an integrated circuit, according to certain aspects of the disclosure. In operation 502, the integrated circuit can determine the occurrence of a trigger condition. In an embodiment, the trigger condition can include an error signal, such as an interrupt. In an embodiment, the trigger condition can be a more generalized condition, such as an architectural condition, defined by a user, implemented, for example, via an x86 server. In some embodiments, the trigger condition is detected, received, and/or processed by a dedicated condition response circuit, such as FOE block 212 in the example of FIG. 2.

In an embodiment, the integrated circuit and/or condition response circuit can receive multiple signals associated with a plurality of conditions. The integrated circuit and/or condition response circuit can then mask a subset including one or more conditions from the plurality of conditions. In particular, the user can control which interrupt types cause the condition response circuit to disable or block the functional clock, and/or terminate processing. For example, the user can program a mask value to determine which interrupts cause processing to suspend and/or terminate. In a further example, the user can control whether to terminate or suspend processing indefinitely, or to resume processing eventually. In various embodiments, the system can resume processing after a preset number of clock cycles, a predetermined time period, or based on some other criterion.

In operation 504, the integrated circuit can disable processing in response to the trigger condition. In an embodiment, the processor circuit can disable processing by gating a clock signal from the functional clock, decoupling the signal, or by other means. In an embodiment, if a subset of trigger conditions has been masked, the condition response circuit does not block the processing circuit in response to the masked conditions.

Thus, process 500 for error handling in an integrated circuit can rapidly disable an integrated circuit's functional clock after a failure, thereby freezing the computational engine in or near the state that triggered an error, as well as preventing a cascade of unrelated secondary errors. Additionally, process 500 can continue to activate the circuit's data block via a separate debug clock to retrieve the state of the hardware circuit. This can allow the user continuous read and write access to the data circuit containing the data at the time of failure, even after the failure occurs.

Figure 5B:
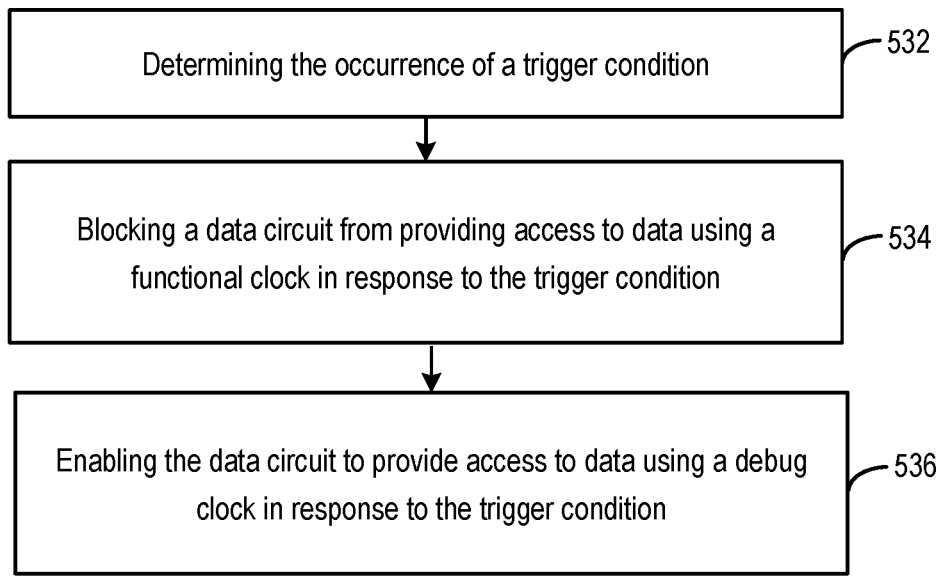
FIG. 5B includes a flowchart illustrating an example of a process for error handling in an integrated circuit, according to certain aspects of the disclosure.

FIG. 5B includes a flowchart illustrating an example of a process 530 for error handling in an integrated circuit, according to certain aspects of the disclosure. In an embodiment, process 530 can provide additional detail of disabling processing in operation 504 of FIG. 5A. In operation 532, the integrated circuit can determine the occurrence of a trigger condition. In an embodiment, the trigger condition can include an error signal, such as an interrupt. In an embodiment, the trigger condition can be a more generalized condition, such as an architectural condition, defined by a user, implemented, for example, via an x86 server. In some embodiments, the trigger condition is detected, received, and/or processed by a dedicated condition response circuit, such as FOE block 212 in the example of FIG. 2 or FOE block 416 in the example of FIG. 4.

In operation 534, the integrated circuit can block a data circuit from providing access to data using a functional clock. For example, the data circuit can include data registers, as in the examples of FIGS. 2 and 4. The functional clock can be configured to be coupled to the data circuit and to enable the data circuit to provide the access to the data. In an embodiment, the integrated circuit and/or the condition response circuit can block the functional clock by a gating signal. In a further embodiment, the integrated circuit and/or the condition response circuit can send a selector signal instructing a multiplexer to deselect the functional clock signal.

In operation 536, the integrated circuit can enable the data circuit to provide access to the data using a debug clock, as in the examples of FIGS. 3 and 4. The debug clock can be configured to be coupled to the data circuit, and to enable the data circuit to provide the access to the data. Accordingly, a user can continue to access the data circuit for input and output even after the functional clock is blocked.

Figure 5C:
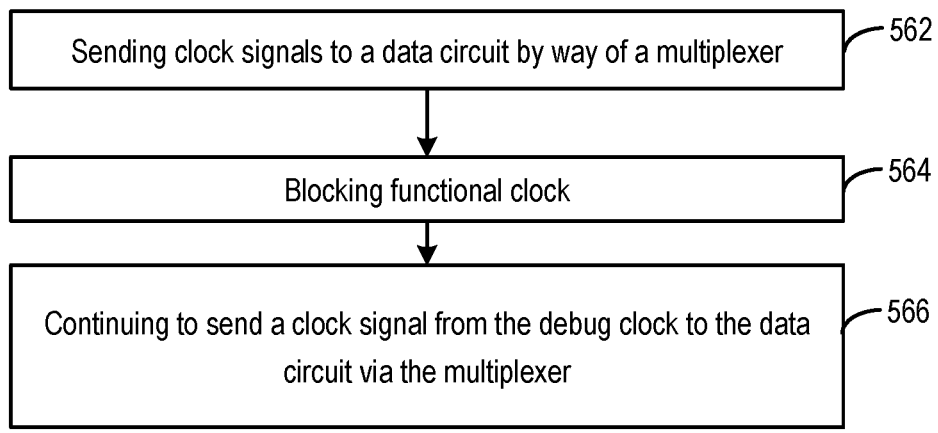
FIG. 5C includes a flowchart illustrating an example of a process for post-failure input/output in an integrated circuit, according to certain aspects of the disclosure.

FIG. 5C includes a flowchart illustrating an example of a process 560 for post-failure input/output in an integrated circuit, according to certain aspects of the disclosure. In an embodiment, process 560 can provide additional detail of disabling processing in operation 504 of FIG. 5A. In operation 562, the integrated circuit can send clock signals from a functional clock, such as functional clock 410 in the example of FIG. 4, to a data circuit by way of a multiplexer. In particular, the multiplexer can receive signals from the functional clock and/or a debug clock, such as debug clock 402 in FIG. 4, and can select between the signals. During normal operating circumstances, the multiplexer may select the signal from the functional clock, as described in the example of FIG. 4.

In operation 564, the integrated circuit can block or disable the functional clock, as described in the example of FIG. 5A. In operation 566, the integrated circuit can select a clock signal from the debug clock via the multiplexer, and allow the debug clock signal to transmit to the data circuit. Note that the data circuit can therefore continue to receive a clock signal without interruption. When the signal from the functional clock ceases, the multiplexer can immediately select the debug clock signal, allowing transmission of the signal to the data circuit. As a result, a clock signal can continuously arrive at the data circuit throughout process 530. Accordingly, the data circuit continues to operate, and can execute subsequent input/output requests, e.g., from an engineer, even after a DUT and/or processing circuit are disabled, preventing further errors.

In an embodiment, the multiplexer can switch to selecting the signal from the debug clock in response to the triggering of a debug condition, coupled with an enable for the debug mechanism. The debug condition (i.e., the condition for selecting the debug clock signal) may be independent from the error response condition, that is, the system may allow a user to set masks and/or conditions for these two events independently. In another embodiment, the debug and error response conditions can be identical. In yet another example, the multiplexer can switch to the debug clock signal in response to the disabling of functional clock and/or failing to receive a signal from functional clock. In an embodiment, the multiplexer can be configured to switch between signals very rapidly, so that the data circuit can continue to receive clock signals substantially without disruption.

In an embodiment, the integrated circuit can further include a read/write memory interface allowing the user to access the data circuit. In an embodiment, this read/write memory interface can be clocked by either the functional clock or the debug clock, or by the multiplexed signal from both clocks. Accordingly, the read/write interface can also be accessible after the functional clock is disabled or blocked, as in operation 564. In an embodiment, writing to the data circuit via the interface enables a user to determine whether changes fix an error. Likewise, a user can write to the data circuit to reproduce a previous error, or to introduce an error purposely, for debugging or testing purposes.

In an embodiment, the user can further implement a register via the x86 server, for example causing the system to shift to debug mode upon detection of the condition. This can be accomplished by writing to a specific API that maps to a register into the hardware engine, and switches from the functional clock to the debug clock. This shift to debug mode can be accomplished, e.g., by use of a selector input signal to a multiplexer selecting the debug clock instead of the functional clock. In an embodiment, the system enables a user to queue up commands for reading data from the registers, which are still memory mapped, then read it out. The debug clock can allow the user to access data for input and output, without propagating an execution pipeline. In an embodiment, all register files switch to running via the debug clock, while all data paths and state machines will have a blocked functional clock.

Figure 5D:
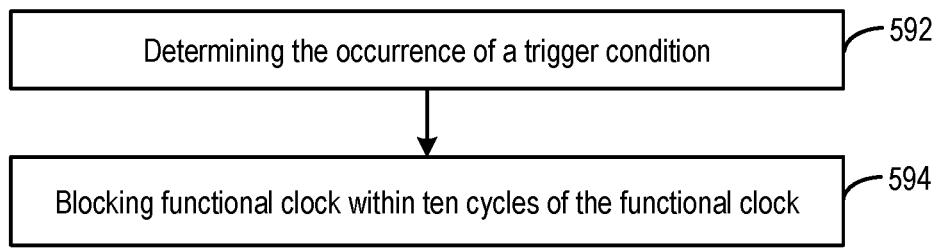
FIG. 5D includes a flowchart illustrating an example of a process for error handling in an integrated circuit, according to certain aspects of the disclosure.

FIG. 5D includes a flowchart illustrating an example of a process 590 for error handling in an integrated circuit, according to certain aspects of the disclosure. In an embodiment, process 590 can provide additional detail of disabling processing in response to the trigger condition, as in operation 504 of FIG. 5A. In operation 592, the integrated circuit and/or a condition response circuit can determine that a trigger condition, e.g., receiving an error signal, has occurred. In operation 594, the integrated circuit and/or the condition response circuit can disable, block, or gate a functional clock within ten cycles of the functional clock (or within another number of cycles). For example, the functional clock can be gated within fewer than five cycles of the functional clock. This can result in the DUT, processing circuit, and/or acceleration engine ceasing operations before any further errors can occur.

Figure 6A:
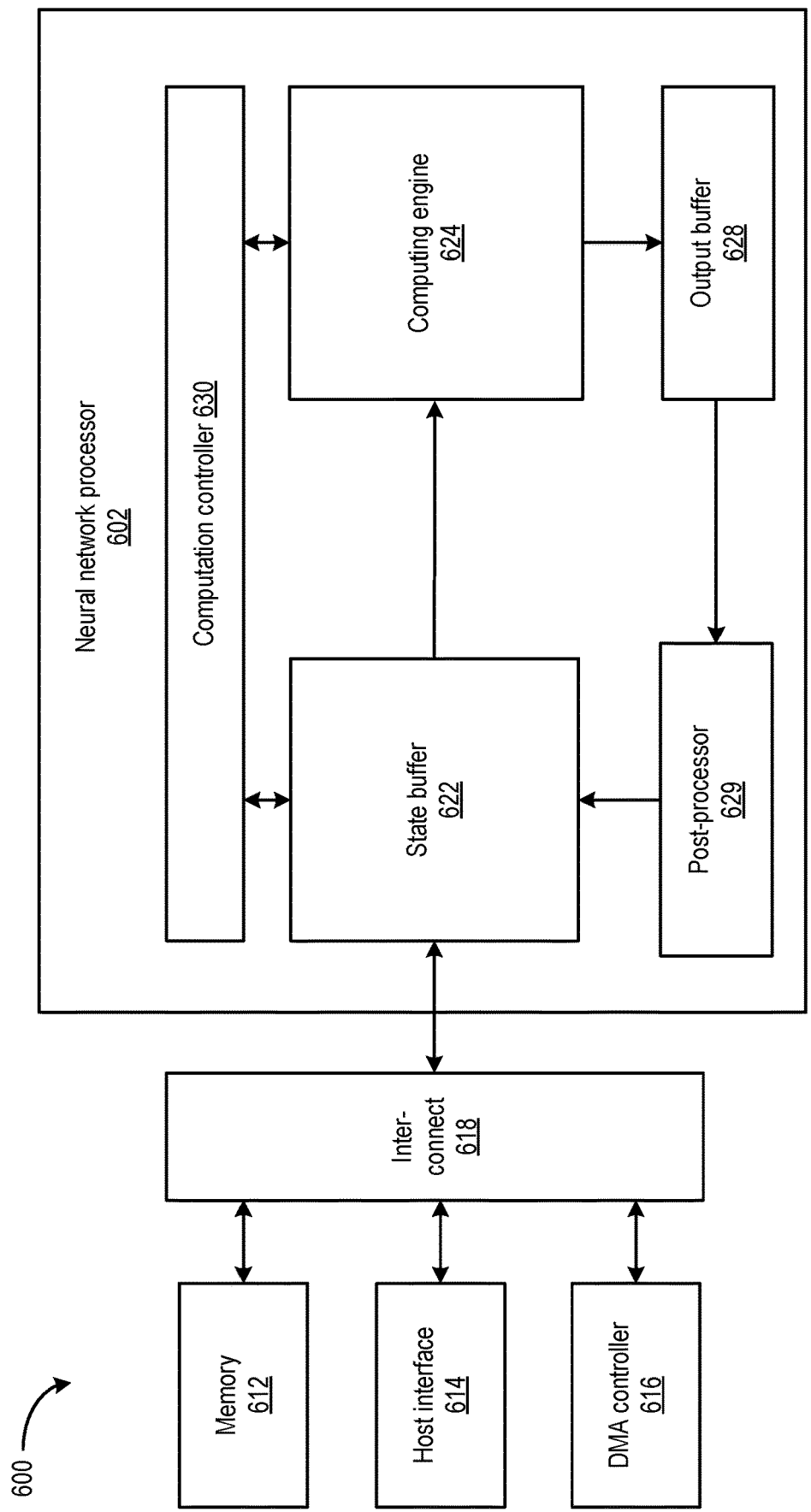
FIG. 6A is a block diagram illustrating an example of a hardware acceleration engine for use with an error handling processor circuit, according to certain aspects of the disclosure.

FIG. 6A shows an apparatus 600 according to some embodiments of the present disclosure. Apparatus 600 may be part of a computer system, e.g., a host server. For example, apparatus 600 can correspond to DUT 204, DUT 304, or DUT 408 in the examples of FIGS. 2-4. Apparatus 600 may be part of a multi-tenant compute service system and can communicate with a host device (not shown in FIG. 6A) to provide computing and memory resources for a computing service. For example, apparatus 600 may provide computing and memory resources for computations that use a prediction model to predict information in a data sequence. Apparatus 600 could use the prediction to perform a pre-determined function, such as for an image recognition service that identifies certain objects (e.g., texts, a person, etc.) from an image. A host device can operate a software application and communicate with apparatus 600 to perform one or more image recognition tasks based on computations with such a prediction model. The host device may transmit multiple image data sets associated with multiple contexts, and provide the multiple image data sets to apparatus 600, which can generate multiple outputs to predict, for example, whether each of the multiple image data sets includes a pre-determined object.

In the example of FIG. 6A, apparatus 600 may include a neural network processor 602 coupled to memory 612, a direct memory access (DMA) controller 616, and a host interface 614 via an interconnect 618. As to be discussed in more detail, neural network processor 602 can provide the computing resources to support the computations with a prediction model. Memory 612 may be configured to store the instructions, input data (e.g., pixel groups) and the weights (e.g., filter arrays)) received from the host device. Memory 612 may also be configured to store the output of neural network processor 602 (e.g., convolution output arrays). Memory 612 may include any suitable memory, e.g., dynamic random access memory (DRAM), synchronous DRAM (SDRAM), double data rate DRAM (DDR DRAM), storage class memory (SCM), flash memory devices, etc.

DMA controller 616 may be configured to perform DMA operations to transfer data between neural network processor 602 and the host device. For example, as discussed above, the host device can store the instructions, input data, and the weights at memory 612. The host device can provide the memory addresses for the stored instructions, data, and weights to neural network processor 602 (e.g., in the form of memory descriptors). Neural network processor 602 can then obtain the stored instructions, data, and weights based on the memory addresses provided by the host device. Neural network processor 602 can also store the results of computations (e.g., one or more image recognition decisions) at memory 612, and provide the memory addresses for the stored results to the host device.

Host interface 614 may be configured to enable communication between the host device and neural network processor 602. For example, host interface 614 may be configured to transmit the memory descriptors including the memory addresses of the stored data (e.g., input data, weights, results of computations, etc.) between the host device and neural network processor 602. Host interface 614 may include, for example, a peripheral component interconnect express (PCIe) interface or any suitable interface for communicating with the host device.

Neural network processor 602 can provide the computing resources to support the computations with one or more instances of a prediction model. In the example of FIG. 6A, neural network processor 602 may include a state buffer 622, a computing engine 624, an output buffer 628, a post-processor 629, and a computation controller 630.

State buffer 622 may be configured to provide caching of data used for computations at computing engine 624. The data cached at state buffer 622 may include, for example, the input data and weights obtained from memory 612, as well as intermediate outputs of computations at computing engine 624. The caching can reduce the effect of memory access bottleneck (e.g., caused by the latencies at memory 612, DMA controller 616, interconnect 618, etc.) on the performance of computing engine 624. State buffer 622 can be controlled by computation controller 630 to pre-fetch a set of weights to computing engine 624, and then fetch the input data as a sequential stream to computing engine 624, which performs the computations and generates a sequential stream of intermediate output data. The stream of intermediate output data can be collected at output buffer 628 and post-processed by post-processor 629. The post-processed stream of intermediate output data can be stored at state buffer 622. The intermediate output data can be stored at a different location in state buffer 622 from where the input data and weights are stored to avoid overwriting, for example, input data that are yet to be fetched to computing engine 624. State buffer 622 can be an on-chip memory device and may include, for example, static random access memory (SRAM).

Computing engine 624 may include a set of circuitries configured to perform one or more arithmetic operations involved in neural network computations. For example, computing engine 624 may include a set of multipliers to perform the scaling of input data with associated weights, and a set of adders to generate a sum of the results of multiplications representing dot-products and convolution results, as discussed above. Computing engine 624 may obtain the weights used for the scaling from state buffer 622. As to be discussed in more detail below, computing engine 624 may obtain the inputs to be scaled from state buffer 622, or from output buffer 628.

In some examples, computing engine 624 may be controlled (e.g., by computation controller 630) to perform computations for different neural network layers sequentially, to reduce the sizes of the weights stored in state buffer 622. For example, computing engine 624 may be controlled to perform the arithmetic operations for one neural network layer within one time period, and then to perform the arithmetic operations for the next neural network layer in the next time period. With such arrangements, state buffer 622 may pre-fetch and cache a set of weights for one neural network layer, instead of caching multiple sets of weights for multiple neural network layers, to support the arithmetic operations at computing engine 624. As a result, the required size for state buffer 622 can be reduced, and the chip size as well as the power consumption of neural network processor 602 can also be reduced. On the other hand, as described above, state buffer 622 needs to provide storage space for both the input data (and the weights) and the output data for computations of at least one neural network layer computation for one context (e.g., an image, or a set of images, associated with a context) to avoid overwriting the input data with the output data for the computations.

Figure 6B:
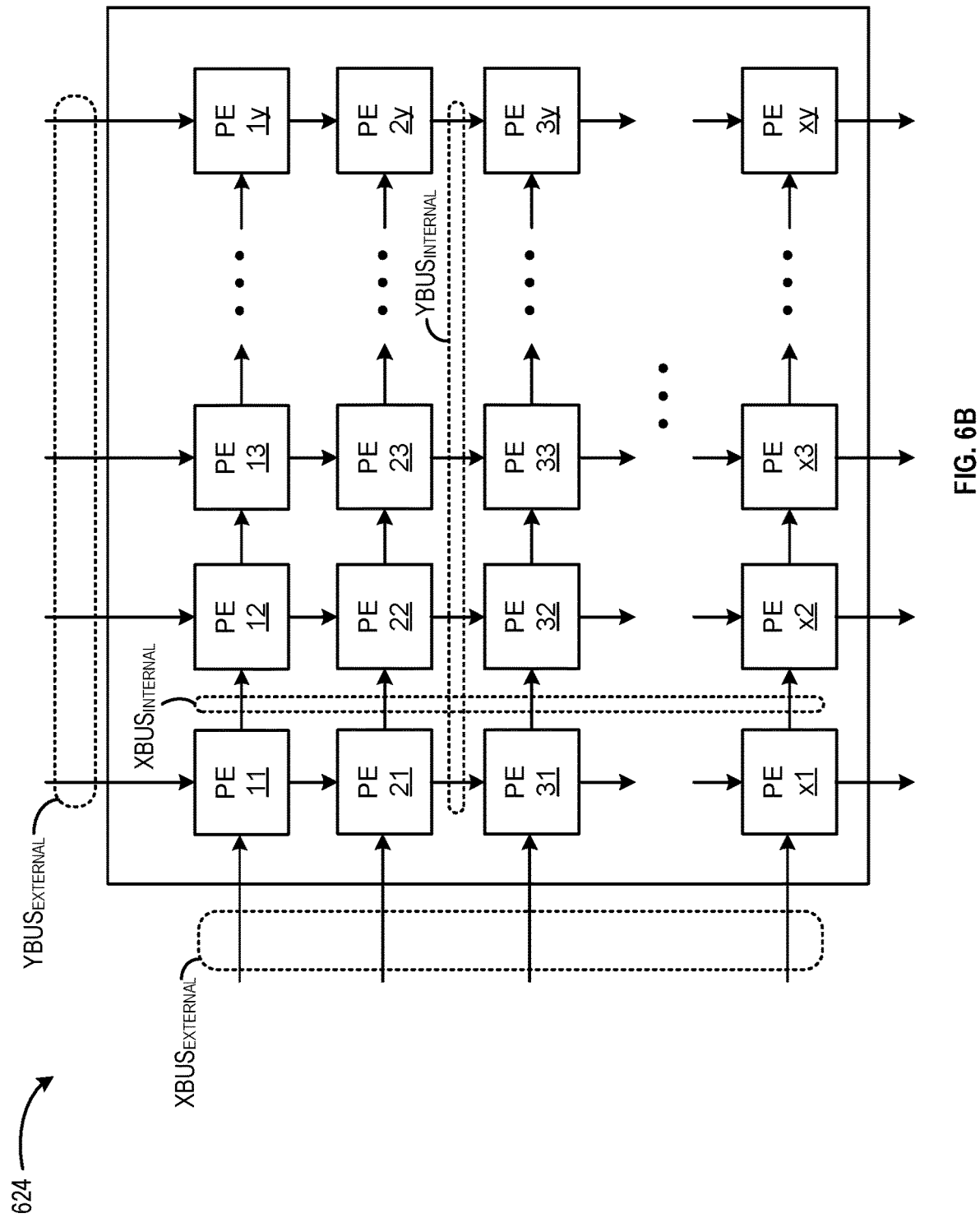
FIG. 6B is a block diagram illustrating an example of a parallel inferential machine learning engine for use with an error handling processor circuit, according to an embodiment.

FIG. 6B illustrates an example of an internal structure of computing engine 624, for which the disclosed system and methods can provide particular advantages. Computing engine 624 may include an array of processing elements (PE) arranged in multiple rows and columns. PEs within one row of computing engine 624 are connected with each other via internal row buses $XBUS_{INTERNAL}$, whereas each of PEs 11, 21, 31, ... x1 is connected to external circuitries via an external row bus $XBUS_{EXTERNAL}$. Moreover, PEs within one column are connected with each other via internal column buses $YBUS_{INTERNAL}$, each of PEs 11, 12, 13, ... 1y is connected to external circuitries via an external column bus $YBUS_{EXTERNAL}$. As to be discussed in more detail below, external row bus $XBUS_{EXTERNAL}$ and external column bus $YBUS_{EXTERNAL}$ are configurable to provide data to the PE arrays from, for example, state buffer 622 and output buffer 628 to scale the computation operations for a particular neural network layer.

In this example, the multiple PEs of computing engine 624 can correspond to a plurality of state machines executing in parallel. A typical computation, e.g., for ML applications, may require a large number of functional clock cycles to complete (e.g., millions, or hundreds of millions, of clock cycles). As a result, upon occurrence of an error, the computational state of the plurality of state machines can become too modified by subsequent computation to allow effective debugging. Accordingly, the disclosed system and methods are particularly advantageous for debugging a massively parallel acceleration or computing engine, such as computing engine 624. In particular, by stopping the functional clock very rapidly after the incidence of an error, the disclosed system and methods improve over conventional debugging techniques by maintaining a computational state close to the one that triggered the error, as well as by preventing a cascade of unrelated secondary error messages. These features can provide improved debugging and root causing information to an engineer.

In some configurations, each column of PEs may perform the scaling and summation computations for one processing node of a prediction model, whereas each row of PEs may perform the scaling and summation computations for one input data set. As an illustrative example, for performing the computations for one layer, each of PEs 11, 12, 13, ... 1y of a first row may receive a pixel value of a pixel group from $XBUS_{EXTERNAL}$. Also, each of PEs 11, 21, 31, ... x1 of a first column may receive an element of a first group of filter sets to generate an output of a convolution output array. Moreover, each of PEs 21, 22, 23, ... 2y of a second row may receive a pixel value of another pixel group from $XBUS_{EXTERNAL}$, whereas each of PEs 12, 22, 32, ... x2 of a second column may receive an element of a second group of filter sets to generate an output of a second convolution output array. Each of the PEs includes a multiplier to perform a multiplication function between the received pixel value and the received weight to generate a multiplication result. Moreover, each of the PEs also includes an adder to accumulate the multiplication results within one column of the PEs. For example, PE 11 generates a first multiplication result based on a first pixel value and a first weight, and passes the first multiplication result to PE 21 via a YBUS. PE21 generates a second multiplication result based on a second pixel value and a second weight based on a second pixel value and a second weight, adds the second multiplication result to generate a partial sum, and passes the partial sum to PE 31 via another YBUS. The other PEs within the same column as PEs 11, 21, and 31 also performs the multiplications and accumulations. PE x1 can then generate a convolution output, and transmit the convolution output via $YBUS_{EXTERNAL}$.

In some configurations, the PEs of computing engine 624 can be used to implement multiple instances of a prediction model. For example, when processing higher level layers with a smaller number of processing nodes and a smaller number of input data, the PEs of the same row can be used to process input data sets of different contexts (e.g., corresponding to different images or different sets of images captured at different locations, times, by different people, or otherwise carrying different information). For example, PE 11 may be configured to process one input data set of a first context, whereas PE 12 may be configured to process another input data set of a second context. Both PE 11 and PE 12 may store the same set of weights and apply the same set of weights to the input data. The first column (comprising PEs 11, 21, ... x1) may be configured to process multiple input data sets of the first context, whereas the second column (comprising PEs 12, 22, ... x2) may be configured to process multiple input data sets of the second context.

Figure 7:
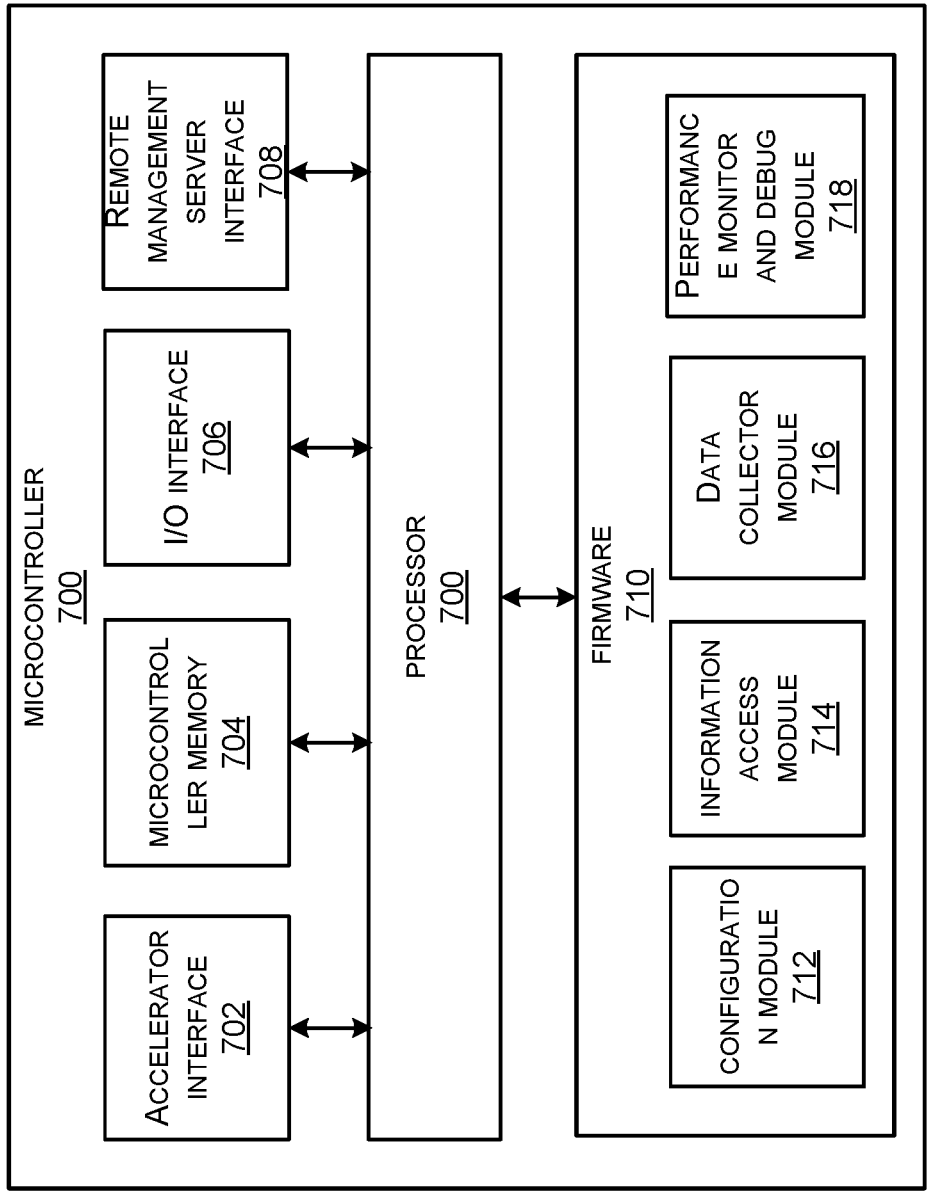
FIG. 7 illustrates an example block diagram for a microcontroller, according to certain embodiments.

FIG. 7 illustrates an example block diagram for a microcontroller 700, according to certain embodiments. In an embodiment, microcontroller 700 can be part of a computing system configured to provide operational management of certain integrated circuits in the computing system. The computing system may be part of a server configured to provide cloud computing services to various clients. The computing system can include a host processor, such as a general purpose processor for executing program instructions, which can also be referred to as the computing system's primary processor, and/or as a Central Processing Unit (CPU). A memory may be accessible by the host processor and the accelerator device(s). The computing system may include a plurality of accelerator devices coupled to the host processor. The accelerator device may be designed to perform certain functions, such as floating point calculations or graphics rendering, more efficiently and can be configured to offload these operations from the host processor. Each accelerator device may include an accelerator engine and a microcontroller 700. The microcontroller may be coupled to a network via a network controller. A remote management server may be configured to provide fleet management services for the cloud.

The microcontroller 700 may include a processor 701 configured to execute firmware 710 to perform operational management and debug of the accelerator engine. The processor 701 may be coupled to an accelerator interface 702, a microcontroller memory 704, an I/O interface 706, and a remote management server interface 708.

The processor 701 may include one or more processor cores configured to execution instructions. For example, the instructions may be in the form of firmware 710. The firmware 710 may be stored in a RAM, ROM, flash memory, EEPROM, or any suitable memory configured to store instructions that can be executed by the processor 701. The firmware 710 may include a configuration module 712, an information access module 714, a data collector module 716, and a debug module 718.

The accelerator interface 702 may be configured to allow communication between the microcontroller 700 and the acceleration engine, such as computing engine 624. In some implementations, the accelerator interface 702 may be based on a synchronous serial interface protocol, e.g., the serial peripheral interface (SPI).

The microcontroller memory 704 may include a RAM or another type of volatile memory. In some implementations, the microcontroller memory 704 may be an independent device or part of another memory. The microcontroller memory 704 may include one or more queues to store one or more types of notification messages. For example, the microcontroller memory 704 may include an error notification queue to store error notification messages and an event notification queue to store event notification messages. In some embodiments, the error notification queue and the event notification queue may be configured by writing to corresponding configuration registers in the system configuration registers. For example, writing to the corresponding configuration registers may include configuring a base address, size, pointers, etc. for each queue.

The I/O interface 706 may include one or more interfaces to one or more I/O devices. In some implementations, the I/O interface 706 may include an interrupt interface to receive interrupts from various I/O devices on the PCIe card, e.g., voltage sensors, clock controllers, temperature sensors, etc. In some implementations, the I/O interface 706 may be used to receive interrupts when there is a change in the physical parameters of the PCIe card (e.g., temperature, humidity, airflow, etc.), which may be used by the microcontroller 700 to monitor physical health of the PCIe card.

The remote management server interface 708 may be configured to communicate with a remote management server via a network. For example, the remote management server interface 708 may be used to communicate with the network controller over the Ethernet. In some embodiments, the remote management server interface 708 may be based on an API based protocol, for example, constrained application protocol (CoAP), or REST, to communicate with the remote management server over the Ethernet. The remote management server may execute fleet management software to configure and manage the accelerator engine.

The configuration module 712 may be used to configure the integrated circuit. For example, the configuration module 712 may be used to write the system configuration registers to configure the notification queues, or to enable the generation of notification messages. The configuration module 712 may also be used to initialize different components of the accelerator engine, e.g., data movement processors, accelerators, memory controllers, by writing to associated registers. In some examples, the configuration module 712 may run some test runs on the PCIe card after initialization to test the default configuration. Once the PCIe card is initialized and tested, the driver executing on the host processor can configure the user registers to start running workloads on the accelerators.

The information access module 714 may be configured to access the information associated with a notification message received by the microcontroller 700 in the microcontroller memory 704. In some implementations, the information access module 714 may access the phase value to determine if a new notification message is received. For example, initially, before any notifications are received, each entry in the error notification queue and the event notification queue may be zero. In this example, when the integrated circuit starts to send notification messages, the integrated circuit can set the phase value in each notification message to one. The information access module 714 may then periodically check the queue entry pointed to by a head pointer to see if the phase value has been changed from zero to one, and when the phase value changes to one, it may be an indication of a new notification message as pointed by the head pointer. The information access module 714 may then access the information associated with the notification message. For example, the information access module 714 may access the timestamp, the notification type, and the metadata associated with the notification type from the notification message. The information access module 714 may also be used to read the system CSRs and the system statistics registers based on the notification type and the metadata. For example, if the notification type indicates an error notification message, the information access module 714 may read the current execution state register in the system CSRs or the current timestamp register. Furthermore, depending on the error identifier in the metadata, the information access module 714 may read a related register in the system statistics registers. In some examples, the information access module 714 may read the relevant registers to collect data related to the notification message for debugging purpose or for monitoring the performance.

The data collector module 716 may be configured to collect data based on the information associated with each notification message received over a period of time. For example, the data collector module 716 may collect data read by the information access module 714 based on the notification type and the metadata in each notification message received over a period of time. In some example, the collected data may be sent to the remote management server via the remote management server interface 708 for analysis. The remote management server interface 708 may use the collected data to create a timeline using the timestamps in the notification messages received over a period of time. The remote management server may determine based on the timeline if a particular accelerator needs to be shut down or the workload needs to be redistributed among the accelerators. In some examples, the remote management server may provide new configuration values via the remote management server interface 708, which can be used by the configuration module 712 to reconfigure one or more data movement processor or the accelerators. In some examples, the collected data may be used by the performance monitor and debug module 718.

In some examples, the performance monitor and debug module 718 may use the collected data for debugging or performance monitoring. For example, the performance monitor and debug module 718 may create a timeline using the timestamps in the notification messages received over a period of time. The performance monitor and debug module 718 may determine if a certain performance threshold is met based on the timeline. The performance monitor and debug module 718 may provide new configuration values to the configuration module 712 if the performance threshold is not met. In some example, performance monitor and debug module 718 may provide new configuration values to the configuration module 712 to test a particular accelerator or the data movement processor while other accelerators and the data movement processors are executing.

Figure 8:
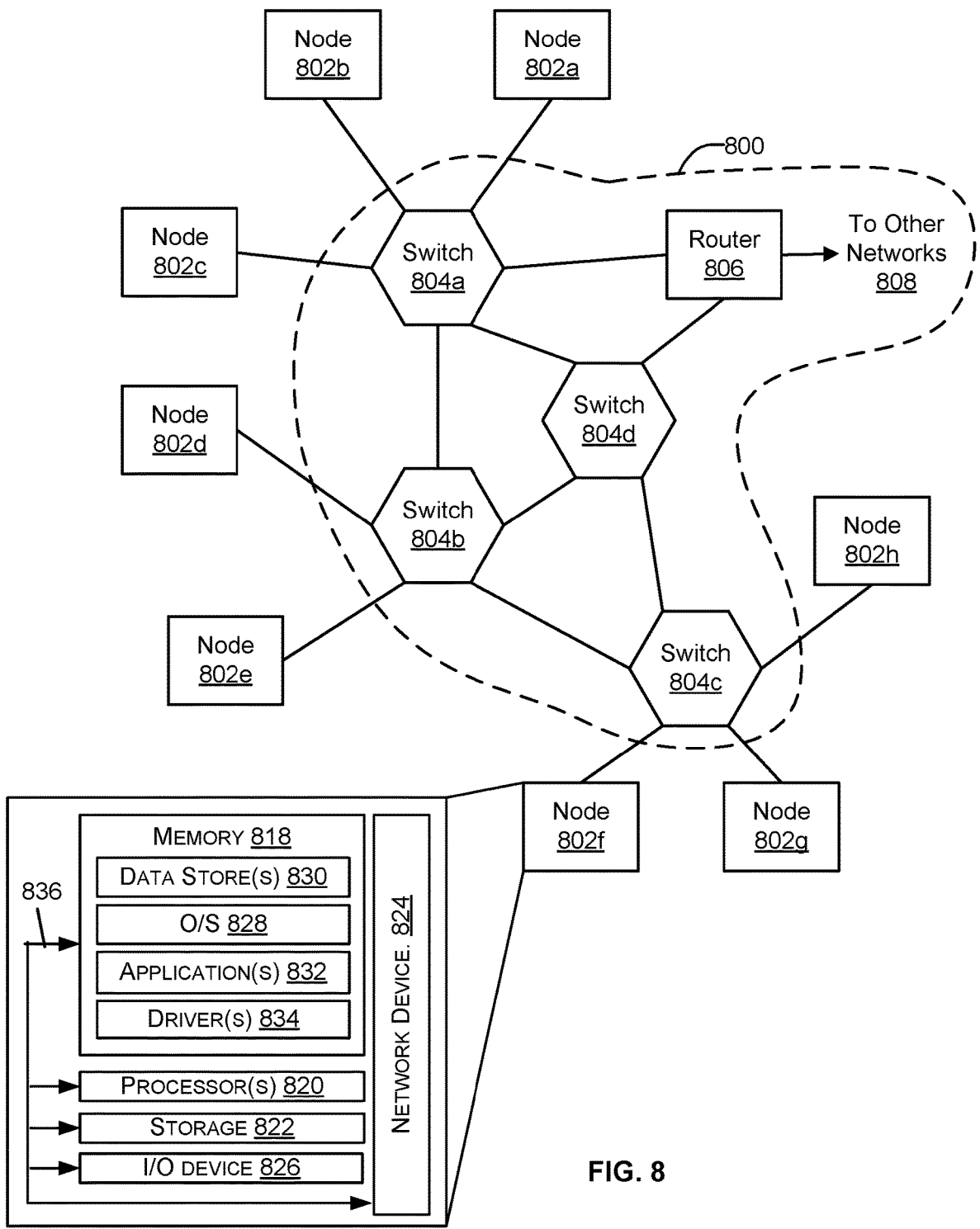
FIG. 8 illustrates an example architecture for features and systems described herein that includes one or more service provider computers and/or a user device connected via one or more networks, according to certain aspects of the disclosure.

FIG. 8 illustrates a network 800, illustrating various different types of network devices, such as nodes comprising the network device, switches and routers. In certain embodiments, the network 800 may be based on a switched architecture with point-to-point links. As illustrated in FIG. 8, the network 800 includes a plurality of switches 804a-804d, which may be arranged in a network. In some cases, the switches are arranged in a multi-layered network, such as a Clos network. A network device that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 804a-804d may be connected to a plurality of nodes 802a-802h and provide multiple paths between any two nodes.

The network 800 may also include one or more network devices for connection with other networks 808, such as other subnets, LANs, wide area networks (WANs), or the Internet, and may be referred to as routers 806. Routers use headers and forwarding tables to determine the best path for forwarding the packets, and use protocols such as internet control message protocol (ICMP) to communicate with each other and configure the best route between any two devices.

In some examples, network(s) 800 may include any one or a combination of many different types of networks, such as cable networks, the Internet, wireless networks, cellular networks and other private and/or public networks. Interconnected switches 804a-804d and router 806, if present, may be referred to as a switch fabric, a fabric, a network fabric, or simply a network. In the context of a computer network, terms "fabric" and "network" may be used interchangeably herein.

Nodes 802a-802h may be any combination of host systems, processor nodes, storage subsystems, and I/O chassis that represent user devices, service provider computers or third party computers.

User devices may include computing devices to access an application 832 (e.g., a web browser or mobile device application). In some aspects, the application 832 may be hosted, managed, and/or provided by a computing resources service or service provider. The application 832 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 808. Additionally, the user device(s) may be part of the distributed system managed by, controlled by, or otherwise part of the service provider computer(s) (e.g., a console device integrated with the service provider computers).

The node(s) of FIG. 8 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 832 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 802a-802h may include at least one memory 818 and one or more processing units (or processor(s) 820). The processor(s) 820 may be implemented in hardware, computer-executable instructions, firmware, or combinations thereof. Computer-executable instruction or firmware implementations of the processor(s) 820 may include computer-executable or machine-executable instructions written in any suitable programming language to perform the various functions described.

In some instances, the hardware processor(s) 820 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 818 may store program instructions that are loadable and executable on the processor(s) 820, as well as data generated during the execution of these programs. Depending on the configuration and type of the node(s) 802a-802h, the memory 818 may be volatile (such as RAM) and/or non-volatile (such as ROM, flash memory, etc.). The memory 818 may include an operating system 828, one or more data stores 830, one or more application programs 832, one or more drivers 834, and/or services for implementing the features disclosed herein.

The operating system 828 may support nodes 802a-802h basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 828 may also be a proprietary operating system.

The data stores 830 may include permanent or transitory data used and/or operated on by the operating system 828, application programs 832, or drivers 834. Examples of such data include web pages, video data, audio data, images, user data, and so on. The information in the data stores 830 may, in some implementations, be provided over the network(s) 808 to user devices 804. In some cases, the data stores 830 may additionally or alternatively include stored application programs and/or drivers. Alternatively or additionally, the data stores 830 may store standard and/or proprietary software libraries, and/or standard and/or proprietary application user interface (API) libraries. Information stored in the data stores 830 may be machine-readable object code, source code, interpreted code, or intermediate code.

The drivers 834 include programs that may provide communication between components in a node. For example, some drivers 834 may provide communication between the operating system 828 and additional storage 822, network device 824, and/or I/O device 826. Alternatively or additionally, some drivers 834 may provide communication between application programs 832 and the operating system 828, and/or application programs 832 and peripheral devices accessible to the service provider computer. In many cases, the drivers 834 may include drivers that provide well-understood functionality (e.g., printer drivers, display drivers, hard disk drivers, Solid State Device drivers). In other cases, the drivers 834 may provide proprietary or specialized functionality.

The service provider computer(s) or servers may also include additional storage 822, which may include removable storage and/or non-removable storage. The additional storage 822 may include magnetic storage, optical disks, solid state disks, flash memory, and/or tape storage. The additional storage 822 may be housed in the same chassis as the node(s) 802a-802h or may be in an external enclosure. The memory 818 and/or additional storage 822 and their associated computer-readable media may provide non-volatile storage of computer-readable instructions, data structures, program modules, and other data for the computing devices. In some implementations, the memory 818 may include multiple different types of memory, such as SRAM, DRAM, or ROM.

The memory 818 and the additional storage 822, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 818 and the additional storage 822 are examples of computer storage media. Additional types of computer storage media that may be present in the node(s) 802a-802h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 802a-802h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 802a-802h may also include I/O device(s) 826, such as a keyboard, a mouse, a pen, a voice input device, a touch input device, a display, speakers, a printer, and the like. The node(s) 802a-802h may also include one or more communication channels 836. A communication channel 836 may provide a medium over which the various components of the node(s) 802a-802h can communicate. The communication channel or channels 836 may take the form of a bus, a ring, a switching fabric, or a network.

The node(s) 802a-802h may also contain network device(s) 824 that allow the node(s) 802a-802h to communicate with a stored database, another computing device or server, user terminals and/or other devices on the network(s) 800.

In some implementations, the network device 824 is a peripheral device, such as a PCI-based device. In these implementations, the network device 824 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 708 may implement NVMe, and the network device 824 may be connected to a computing system using a PCIe interface.

A PCI-based device may include one or more functions. A "function" describes operations that may be provided by the network device 824. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 824 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 7, FIG. 8, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit, comprising:
  a processing circuit including an acceleration engine having a plurality of states, the processing circuit capable of executing operations;
  data registers coupled to the processing circuit, the data registers capable of accessing and storing data during the execution of the operations by the processing circuit;
  a functional clock configured to be coupled to the processing circuit and to the data registers, wherein the processing circuit executes the operations using the functional clock; and
  an error response circuit that, in response to an error notification, is configured to:

block the processing circuit from using the functional clock for executing the operations;

block the data registers from using the functional clock for accessing or storing the data; and enable the data registers to use a debug clock for accessing or storing the data while the data registers are blocked from using the functional clock.

2. The integrated circuit of claim 1, wherein the error response circuit blocks the processing circuit and the data registers from using the functional clock by a gate signal.

3. The integrated circuit of claim 1, wherein the processing circuit comprises an inferential machine learning (ML) engine.

4. An integrated circuit, comprising:
a data circuit coupled to a processing circuit including an acceleration engine having a plurality of states, the data circuit capable of providing access to data;
a functional clock configured to be coupled to the data circuit and to enable the data circuit to provide the access to the data;
a debug clock configured to be coupled to the data circuit and to enable the data circuit to provide the access to the data; and
a condition response circuit that in response to a condition is configured to:
block the data circuit from providing the access to the data using the functional clock; and
enable the data circuit to provide the access to the data using the debug clock.

5. The integrated circuit of claim 4, wherein:
the functional clock is configured to be coupled to the processing circuit; and
the condition response circuit is further configured, in response to the condition, to block the processing circuit from executing operations.

6. The integrated circuit of claim 5, wherein the condition response circuit blocks the processing circuit and the data circuit from using the functional clock by a gate signal.

7. The integrated circuit of claim 5, wherein the data circuit is configured to continue receiving a clock signal from the debug clock without disruption via a multiplexer after the processing circuit is blocked.

8. The integrated circuit of claim 5, wherein the acceleration engine comprises an inferential machine learning (ML) engine.

9. The integrated circuit of claim 4, wherein the condition comprises receiving an error signal, the error signal generated in response to an error and propagated to the condition response circuit.

10. The integrated circuit of claim 9, wherein the error comprises a data corruption error or a memory soft error.

11. The integrated circuit of claim 4, wherein the condition comprises receiving an interrupt request (IRQ).

12. The integrated circuit of claim 4, wherein the condition response circuit is further configured to:
receive signals associated with a plurality of conditions; and
mask a condition from the plurality of conditions such that the condition response circuit does not block the data circuit from providing the access to the data using the functional clock in response to the masked condition.

13. The integrated circuit of claim 4, wherein a clock frequency of the debug clock is lower than a clock frequency of the functional clock.

14. The integrated circuit of claim 4, wherein the condition response circuit is configured to block the data circuit from providing the access to the data using the functional clock within fewer than ten cycles of the functional clock after the condition.

15. The integrated circuit of claim 4, wherein the data circuit comprises a register file.

16. The integrated circuit of claim 4, wherein the condition comprises receiving a write to a register to enter a debug mode.

17. A method, comprising:
detecting, by a condition response circuit associated with an integrated circuit, a condition; and
in response to detecting the condition:
blocking a data circuit coupled to a processing circuit from providing access to data using a functional clock, wherein the functional clock is configured to be coupled to the data circuit and to enable the data circuit to provide the access to the data and wherein the processing circuit includes one or more of an acceleration engine having a plurality of states, or an inferential machine learning (ML) engine; and
enabling the data circuit to provide the access to the data using a debug clock, wherein the debug clock is configured to be coupled to the data circuit and to enable the data circuit to provide the access to the data.

18. The method of claim 17, further comprising, in response to the condition, blocking a processing circuit from executing operations using the functional clock.

19. The method of claim 17, wherein the condition comprises receiving an error signal, the error signal generated in response to an error and propagated to the condition response circuit.

20. The method of claim 17, wherein the condition is programmable.

* * * * *